United States Patent
Bormann

(10) Patent No.: US 7,448,222 B2
(45) Date of Patent: Nov. 11, 2008

(54) THERMOELECTRIC REFRIGERATION SYSTEM

(76) Inventor: Ronald M. Bormann, 120 W. Dallas Ave., McAllen, TX (US) 78501

(*) Notice: Subject to any disclaimer, the term of this patent is extended or adjusted under 35 U.S.C. 154(b) by 862 days.

(21) Appl. No.: 10/999,275

(22) Filed: Nov. 29, 2004

(65) Prior Publication Data
US 2006/0117761 A1    Jun. 8, 2006

Related U.S. Application Data

(60) Provisional application No. 60/529,020, filed on Dec. 15, 2003.

(51) Int. Cl.
F25B 21/02    (2006.01)
(52) U.S. Cl. .............. 62/3.7; 62/3.3; 62/3.6; 62/259.2; 165/104.33
(58) Field of Classification Search ......... 62/3.2, 62/3.3, 3.6, 3.7, 259.2; 165/104.33, 274; 361/687
See application file for complete search history.

(56) References Cited

U.S. PATENT DOCUMENTS

| | | | |
|---|---|---|---|
| 4,011,104 A | 3/1977 | Basiulis | |
| 5,642,622 A * | 7/1997 | Berchowitz et al. | 62/6 |
| 5,890,371 A | 4/1999 | Rajasubramanian et al. | |
| 6,209,631 B1 * | 4/2001 | Garcia-Ortiz | 165/287 |
| 6,272,867 B1 * | 8/2001 | Barrash et al. | 62/6 |
| 6,298,669 B1 * | 10/2001 | Maruyama et al. | 62/3.2 |
| 6,351,951 B1 | 3/2002 | Guo et al. | |
| 6,474,074 B2 * | 11/2002 | Ghoshal | 62/3.7 |
| 6,521,991 B1 * | 2/2003 | Yamada et al. | 257/712 |
| 6,646,874 B2 * | 11/2003 | Pokharna et al. | 361/687 |
| 6,880,346 B1 * | 4/2005 | Tseng et al. | 62/3.7 |
| 7,111,465 B2 * | 9/2006 | Bell | 62/3.7 |

* cited by examiner

Primary Examiner—Melvin Jones
(74) Attorney, Agent, or Firm—John F Bryan

(57) ABSTRACT

Apparatus for thermoelectric cooling of an insulated enclosure having a plurality of thermoelectric cooling units, with their cold sides exposed to the enclosure interior, where they are affixed to an array of individual, self-sufficient interior heat pipes through a conductive metal connecting member. Their hot sides are exposed to the ambient exterior and similarly affixed to an array of individual, self-sufficient exterior heat pipes, each set of heat pipes having a stack of fins affixed; interior fins to collect heat and exterior fins to disburse heat.

11 Claims, 5 Drawing Sheets

THERMOELECTRIC REFRIGERATION SYSTEM

This is a nonprovisional application claiming benefit of the filing date of provisional application No. 60/529,020, filed on Dec. 15, 2003.

FIELD OF THE INVENTION

The present invention relates to the field of thermoelectric cooling and more particularly to methods and apparatus for transfer of heat energy to and from thermoelectric devices.

BACKGROUND OF THE INVENTION

The Thermoelectric Cooler, or TEC, is well known as a type of electronic heat pump to those skilled in the art of heat transfer. A major difficulty in using these in refrigeration devices is that as the temperature differential across the TEC becomes greater, its efficiency decreases. Adding TEC units, to make up for the loss of efficiency, simply drives efficiency lower, to the point that cost, packaging considerations and operating expense render TECs impractical for all but very small refrigeration units.

Another problem with these devices is that thermal stresses often cause cracking. This can come about because of expansion and contraction across the hot and cold plates to which the devices are mounted, wherein abrupt changes of drive current leads to thermal shock. The amount of work done by each junction of a TEC s a function of the temperature across it. Inasmuch as all junctions in a single TEC are in series connection, and in many cases multiple TECs are also in series connection, the overall efficiency is the product of the junction efficiencies and overloading of one or several junctions will lead to thermal stress and related problems.

In removing heat from the hot side, or conducting heat to the cold side, an increase in the physical size of the plate and an increase in the volume and/or velocity of air flowing over this plate will result in an increase in the heat energy transferred. This reduces the temperature difference across the TEC.

A problem in achieving this solution is found in the thermal resistance of any thermally conductive material. Any increase in the distance traveled or the amount of heat energy transferred will cause a greater temperature differential and a decrease of overall efficiency. The flow of heat through a material creates a temperature drop that adds to the TEC temperature differential and results in a decrease of system efficiency.

Heat pipes are also well known to those skilled in the art. Whatever heat energy is absorbed in the process of evaporation of a fluid contained in a heat pipe is released when the fluid condenses. The only thermal resistance will be that of the tube walls of the device. Heat can be absorbed at a high transfer rate at a concentrated area and released over a greater area at a lower rate of transfer per unit area as long as the amount of heat "in" equals the amount of heat "out". This will work in both directions, so that this effect can be used to move heat to or from a TEC with a minimum temperature differential due to thermal resistance. Any point above the average temperature of the total heat pipe will act as an evaporator, and any point below the average temperature of the heat pipe will act as a condenser. With the resulting transfer of heat energy, the temperature of all points on the heat pipe will become equal, neglecting the effects of any thermal resistance due to its construction.

The amount of heat that can be transferred by a heat pipe is a function of the latent heat of vaporization of the fluid used and the volume of working fluid that can physically be evaporated, transported, and condensed per unit time. Fluid volume processing capacity is limited by the heat transferring areas of the evaporator and condenser and the physical capacity of the heat pipe to transport vapor and fluid.

Prior art devices have addressed the problem of heat transfer to and from the TEC by respective heat pipes by using common working fluid evaporator or condenser volumes to interface with a grouping of TECs. The inherently unequal distribution and inefficient fluid flow characteristics cause unequal TEC load distribution as a basic problem in such a configuration. In addition, since heat pipes commercially available only as closed end tubes, manufacturing costs of such a configuration are excessive for commercial applications. This is especially true if the heat pipes are of the wicked and cored type, as are desirable for this application. Osmotic or mechanically pumped heat pipes introduce added complexity and expense to a device. Loop configuration heat pipes will have thermal gradients from top to bottom, inasmuch as this is the mechanism used to cause the fluid to rise in one arm of the loop and fall in the other. In this application, thermal gradients may cause thermal stress and unequal sharing of heat pumping loads in the TECs as described above. Basic open thermo-syphon configurations, without core or wicking, are low efficiency devices because of liquid pooling and thermal resistance effects in the fluid itself. Another problem is that as the fluid evaporates, it forms bubbles on the walls of the evaporator section that insulate the wall from the fluid. At the condensing end of a thermo-syphon, as the fluid becomes a liquid, the droplets interfere with contact of the vapor to the wall, again reducing efficiency. Any increase of the amount of heat energy to be transferred increases the magnitude of the problems in a thermo-syphon.

TECs are electronic heat pumps. One of the characteristics that often causes difficulties in employing these for refrigeration is that the amount of heat pumped per Watt of electricity used has an inverse relationship to temperature across the device. For example a particular TEC may pump 204.8 BTU/H at a temperature of 10C and an electrical input of 95.8 Watts, but if the temperature becomes 30C, this same device may only pump 136 BTU/H with the same 95.8 Watts of electrical input.

The relationship between amount of heat pumped (BTU/H) and the temperature differences developed across any material this heat flows through is "thermal resistance"— $R_{TH}$. If T=temperature, $R_{TH}$=thermal resistance, and heat flow through the material is in BTU/H the relationship is: $T = BTU/H \times R_{TH}$. This points to the main reason that thermoelectric devices are not more commonly used for refrigeration. As we attempt to move heat, the effect of the thermal resistance will cause a rise in temperature across all elements of the apparatus through which the heat must flow and this will degrade the ability of the TEC to pump this heat.

Although metals in general are good heat conductors, the use of aluminum, or even copper, as heat sinks will build the thermal resistance of these metals into a refrigeration system. This results in a significant temperature differential between the TEC and the radiator or absorber over the distances involved in coupling the small TEC to the large surface area needed to collect or dissipate heat. In the past this has generally limited TEC systems to the cooling of small enclosures or maintaining a small device at a regulated low temperature, A first object of the invention therefore, is to provide a TEC driven refrigeration system with sufficient capacity for use in typical home and commercial applications. A second object is that the operating costs of this TEC driven refrigeration system be equal or less than prior art mechanical systems. A third object is that this TEC driven refrigeration system be no more expensive to manufacture than prior art mechanical systems and yet another object is to mitigate the problems associated with thermal stresses so that these systems be more reliable in operation than prior art systems.

SUMMARY OF THE INVENTION

The present inventions are described in the following by referring to drawings of examples of how the inventions can be made and used. In these drawings, reference characters may be used throughout the views to indicate like or corresponding parts. The embodiments shown and described herein are exemplary. Many details are well known in the art, and as such are neither shown nor described. The invention addresses the aforesaid objects through a novel application of heat pipe technology. A practical refrigeration system for an application such as a soft drink vending machine calls for an enclosure temperature of 34F under ambient temperatures of approximately 95F and the ability to cool a full load of drinks in 12-14 hours. This requires a cooling capacity of approximately 3,300 BTU/H.

A variety of TECs are available and one which will pump 154 BTU/H at a temperature differential of 73F, so that approximately 22 such units are required is selected for the present invention. Heat pipes using water on the hot side and methanol on the cold side as working fluids. They are constructed with a sintered metal powder wick attached to the inside walls of the pipes and have an open core down the center of the pipe for vapor flow. These heat pipes minimize the thermal resistance encountered in transporting heat to and from the TECs. At both the hot and cold sides, the TECs are all joined to one face of a thin copper strip and the heat pipes are joined to the opposite face. The connecting copper tends to balance loading of the TECs and of the heat pipes. The opposite ends of the heat pipes are joined into a stack of fins, so as to provide adequate heat transfer area.

Thus, the invention couples room air to the hot side of a TEC such that this side stays as close to room temperature as is practically possible under full load operation, and couples enclosure air to the cold side of the same TEC to achieve the desired setpoint air temperature. Because of the physics of heat pipe operation, the input temperature for all of the finned structure will be the temperature of the heat pipe end attached to the TEC.

Prior art practice has been to run refrigeration systems in either an "OFF" or "ON" mode, which induces "thermal shock" as rapid expansion and contraction cause fatigue stresses throughout the system. These stresses become increasingly severe as power inputs exceed 100 Watts. The present invention is applied to systems with far greater power capacity by ramping the electrical drive to the thermoelectric devices up or down, providing just enough power to offset thermal leakage. This eliminates, or at least minimizes, the fatigue stresses that otherwise, would eventually cause system failure.

BRIEF DESCRIPTION OF THE DRAWINGS

The accompanying drawings are incorporated into the specification to assist in explaining the present inventions. The drawings illustrate preferred and alternative examples of how the inventions can be made and used and are not to be construed as limiting the inventions to only those examples illustrated and described. The various advantages and features of the present inventions will be apparent from a consideration of the drawings in which.

DETAILED DESCRIPTION OF THE DRAWINGS

Figure 1:
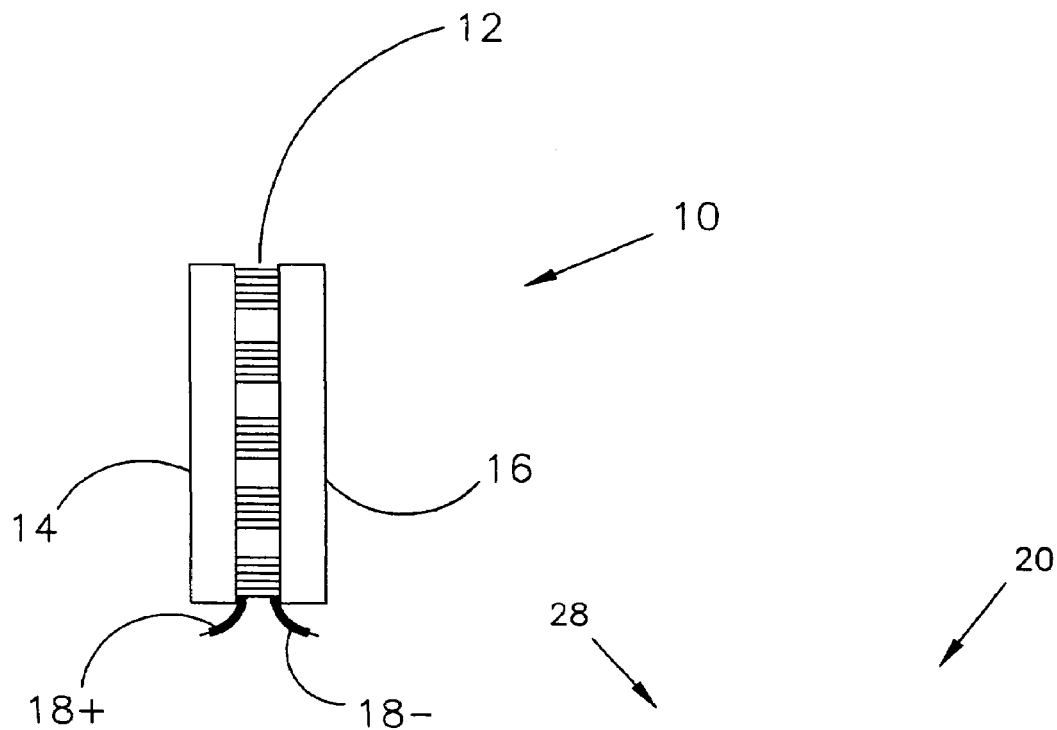
FIG. 1 shows a generic, prior art thermoelectric cooler.

The present inventions are described in the following by referring to drawings of examples of how the inventions can be made and used. In these drawings, reference characters may be used throughout the views to indicate like or corresponding parts. The embodiments shown and described herein are exemplary. Many details are well known in the art, and as such are neither shown nor described.

FIG. 1 shows a prior art thermoelectric cooler (TEC) 10 of the generic type used in the present invention. TEC 10 has solid state thermo-electric junctions 12, with hot ceramic side member 14 and cold ceramic side member 16. Power for driving TEC 10 is provided by means of electrical lead wires 18+ and 18−. When an electric current flows through lead wires 18+ and 18−, heat is absorbed at cold side 14 and moved, together with heat generated by resistive losses in the device, to hot side 16.

Figure 2:
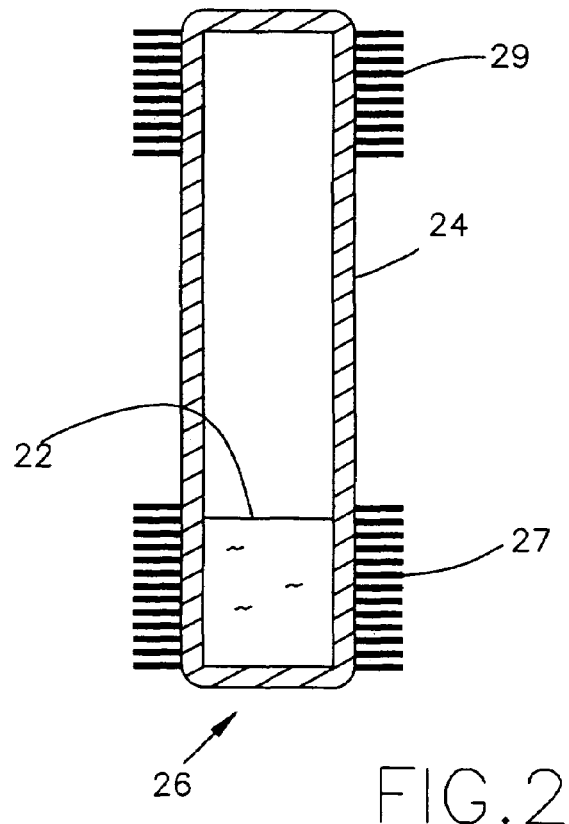
FIG. 2 shows a section view of a prior art heat pipe.

FIG. 2 shows a prior art heat pipe 20 of the generic type used in the present invention. Heat pipes move thermal energy much faster than it could travel in a solid metal heat sink and with less temperature difference needed to cause thermal flow from source to radiating surface. This heat transfer occurs because of working fluid 22, enclosed in pipe 24 at a low pressure, boils at any temperature warmer than the designed average at heat absorbing end 26. The heat picked up through collecting fins 27 is absorbed in the latent heat of vaporization of the liquid to gas phase change. This heat is given up through heat dissipating fins 29 at cool end 28 when the vapor condenses there. Since these phase changes occur at the same temperature, temperatures tend to equalize over the heat absorbing and heat radiating areas. Thus, heat is quickly transported from a small, relatively warm area to a much larger radiating surface. The liquid to vapor phase change causes this device to absorb far more thermal energy than if the same working fluid were simply pumped from the absorber to the radiator. The difference between the evaporative and condensing temperatures and the amount of heat absorbed can be tailored to a given application by the selection of a suitable working fluid and internal pressure.

Figure 3:
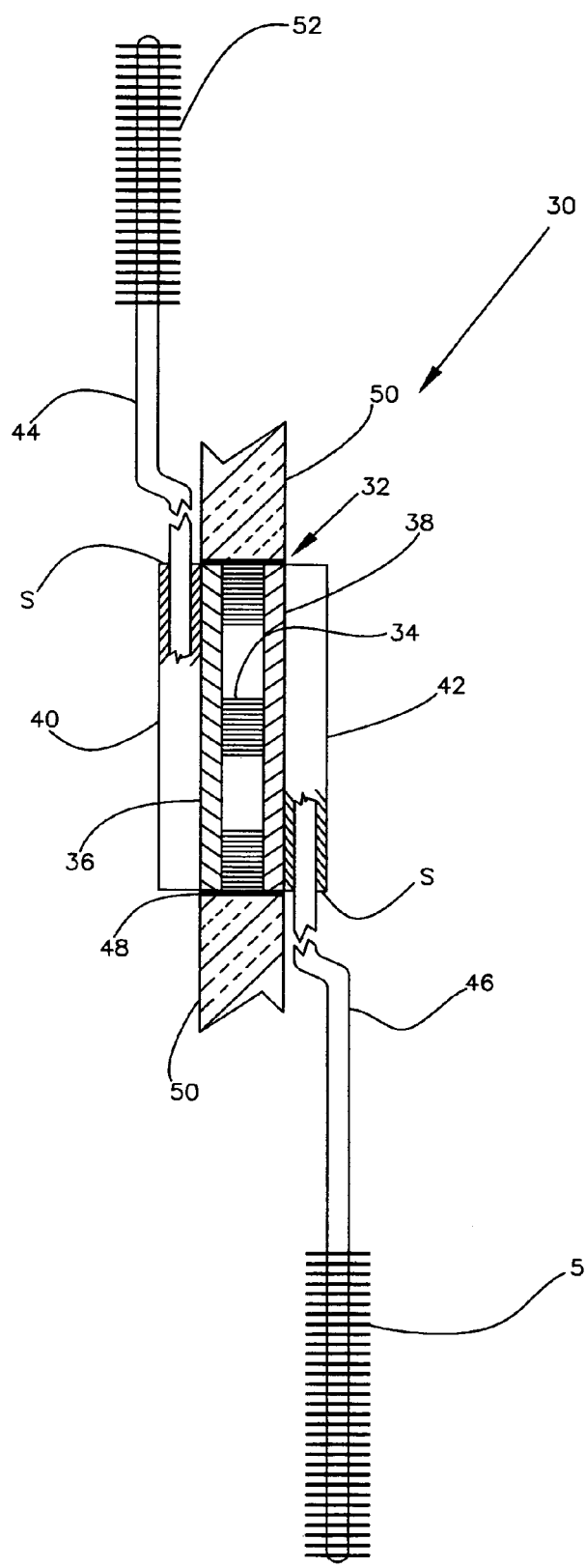
FIG. 3 shows a simplified view of the system of the present invention.

FIG. 3 shows a schematic embodiment 30, representative of the present invention. Here TEC 32 is seen to comprise thermoelectric elements 34 sandwiched between cold side ceramic face 38 and hot side ceramic face 36. TEC 32 is mounted in a closely fitting hole in insulated barrier 50 that may be closed to leakage with sealant 48 if necessary. As shown below in FIG. 5, conductive plate 40 and conductive plate 42 are held in close contact with hot side ceramic face 36 and cold side ceramic face 38 respectively. The preferred material for conductive plates 40 and 42 is copper although silver, aluminum or other conductive materials may be used. Individual, self contained hot side heat pipes 44 and cold side heat pipe 46 are joined into hot and cold side conductive plates 40 and 42 by soldered connections "S". The preferred working fluids of the present invention are methanol for the cold side heat pipes 46 and water for the hot side heat pipes 44. A stack of heat disbursing fins 52, joined to heat pipes 44, and a stack of heat collecting fins 54, joined to heat pipes 46 complete this embodiment.

In order to minimize the thermal difference the TEC must pump heat against, hot side 16 should be as close to ambient temperature as possible and cold side 14 as close to desired setpoint temperature as possible.

Figure 4:
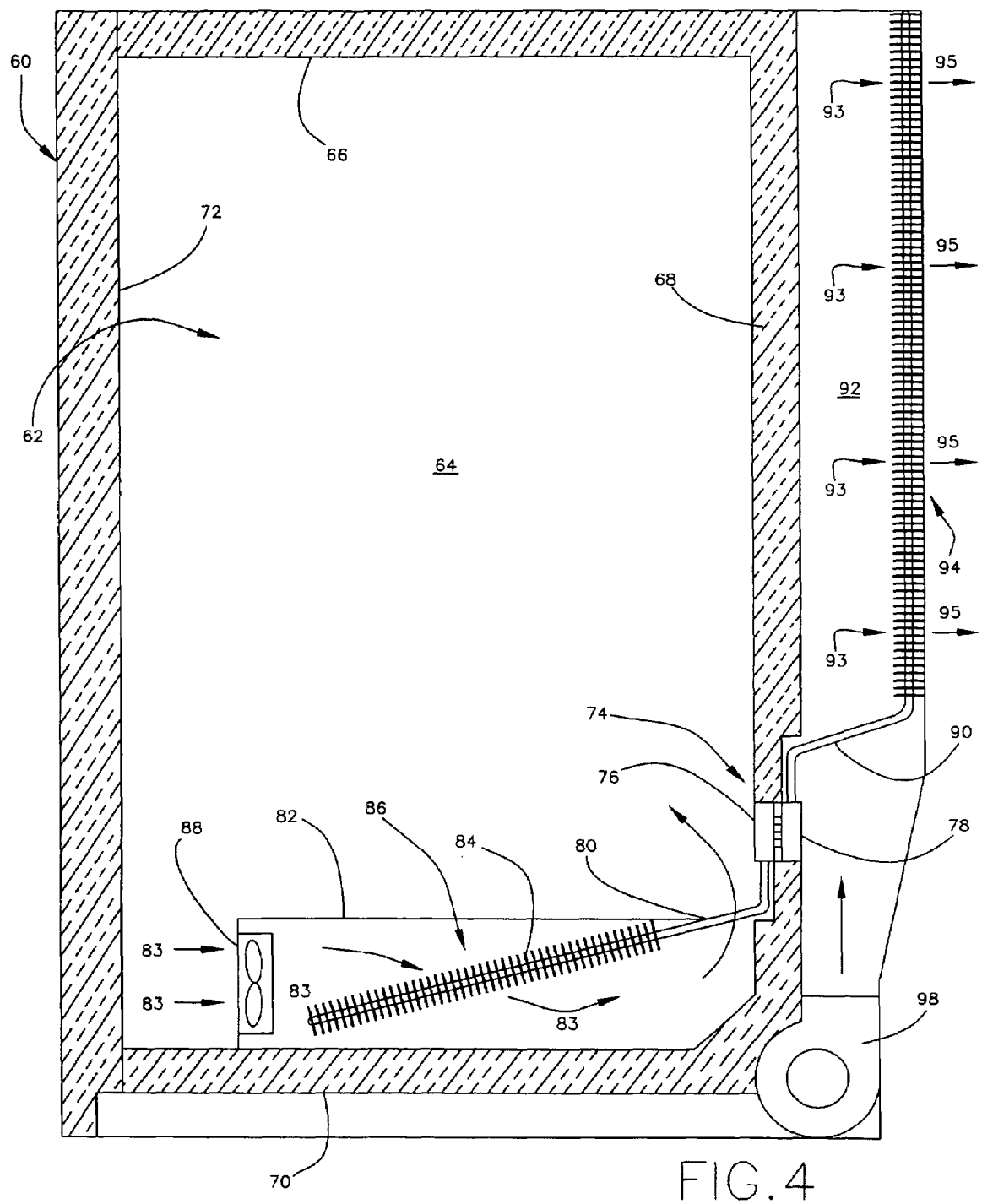
FIG. 4 shows a section view of a cold drink vending machine utilizing the present invention.

FIG. 4 shows cold drink vending machine 60 embodying the present invention. Here, enclosure 62, which houses the (unshown) drink storage and delivery conveyors, is contained by insulated top 66, insulated side walls 54, insulated back wall 68, insulated floor 70 and insulated door 72. TEC array 74 is mounted in back wall 68, with conductive cold side plate 76 exposed to interior 62 and conductive hot side plate 78 projecting through back wall 68, exposed to the exterior air. It is preferred that cold side plate 76 and hot side plate 78 be common, continuous members, each joined to all units of TEC array 74. Cold side heat pipes 80 are joined to cold side plate 76 and extends into air box 82 where collecting fin stack 84 joins all of the heat pipes 80 together as heat collecting array 86. Fan 88 moves interior air through heat collecting array 86 as represented by arrows 83 so as to effect the desired phase change of the (unshown) methanol working fluid in heat pipes 80.

Conductive hot side plate 78, projecting through back wall 68 and exposed to the exterior air as previously described, is joined to all units of TEC array 74. Hot side heat pipes 90 are joined to hot side plate 78 and extends into air box 92 where collecting fin stack 94 joins all of the heat pipes 90 together as heat dissipating array 96. Fan 98 moves interior air through heat collecting array 96 as represented by arrows 93 so as to effect the desired phase change of the water (unshown) working fluid in heat pipes 90.

Figure 5:
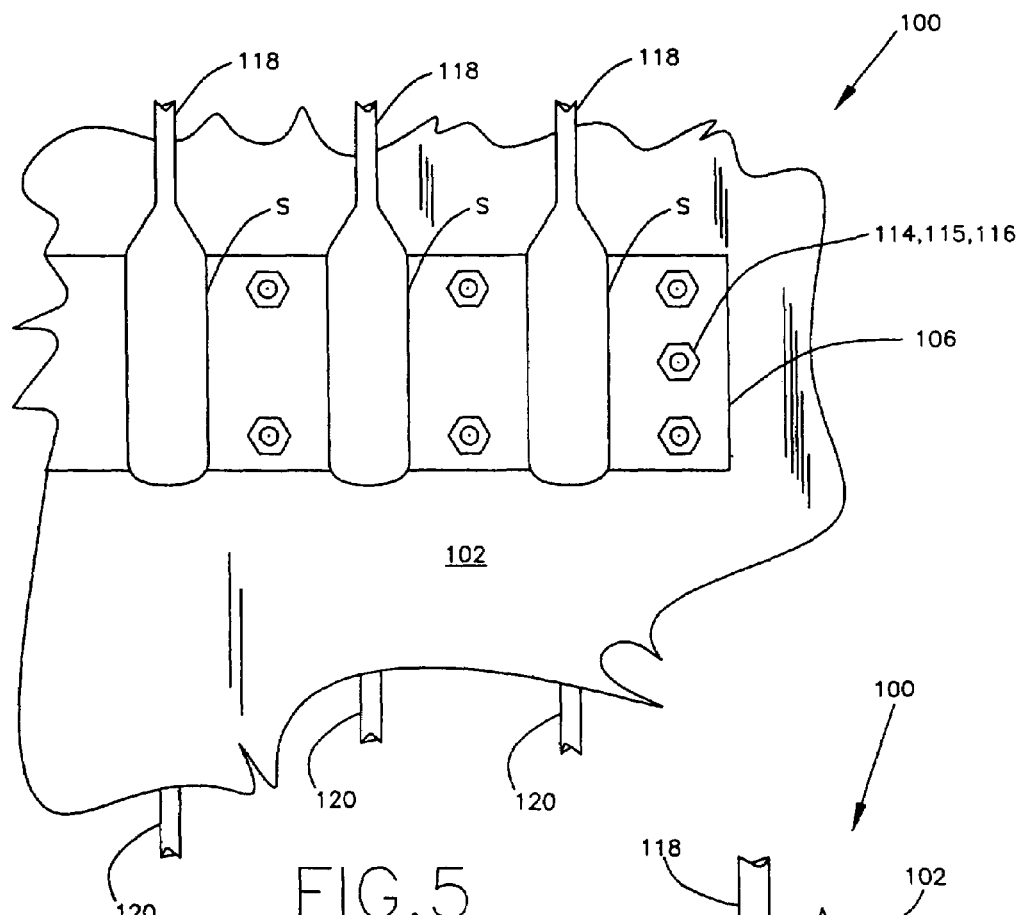
FIG. 5 shows a view of a preferred connection of heat pipes to a hot or cold side metal plate.
Figure 5A:
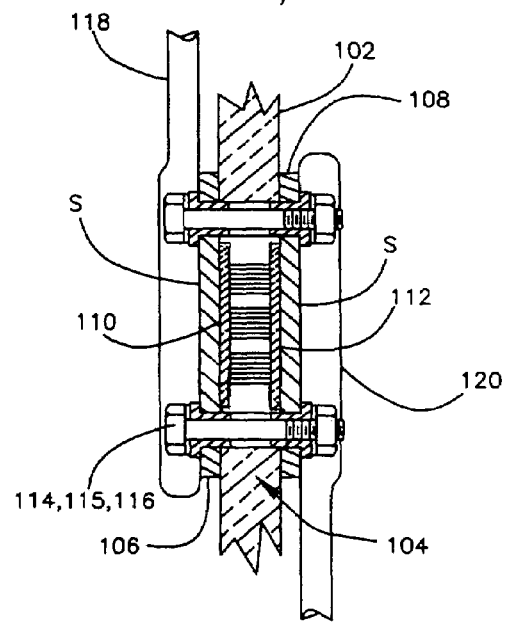
FIG. 5A shows a cross-section view of the heat pipe connection of FIG. 5.

FIGS. 5 and 5A show a preferred manner of joining a TEC to heat pipes as embodiment 100. Insulated wall 102 includes holes sized to receive TECs 104. The local thickness of insulated wall 102 is such that common, conductive plates 106 and 108 may be clamped against hot and cold side ceramic faces 110 and 112 respectively. A conductive grease, such as "Arctic Silver" thermal compound, is used at the interfaces to provide good thermal coupling of conductive plates 106 and 108 to ceramic faces 110 and 112. Positive clamping forces to maintain the coupling are provided by through bolts 114 and retaining nuts 116. Flanged insulator bushing 115 prevent nylon bolts 114 from contacting TECs 104 or conductive plates 106 and 108.

Hot side heat pipe 118 is affixed to hot side conductive plate 106 by soldered connection "S", as is cold side heat pipe 120 to cold side conductive plate 108.

Each TEC 104 comprises multiple active thermoelectric junctions 122. These junctions are the parts that do the actual work of "pumping" thermal energy. Any variation of temperature differential between junctions 122 causes variations in drive voltage and current, leading to different amounts of work being done by each junction (at generally lower efficiencies) and a drop in overall performance. The higher power load placed on some TECs results in thermal stresses that eventuate in fatigue failure. Common conductive plates 106 and 108 and shared fin stacks (unshown) in these views) even out temperature variations across the working surfaces of the TECs. more effectively than the prior art method of attaching all of them to a common heat sink or absorber.

Figure 6:
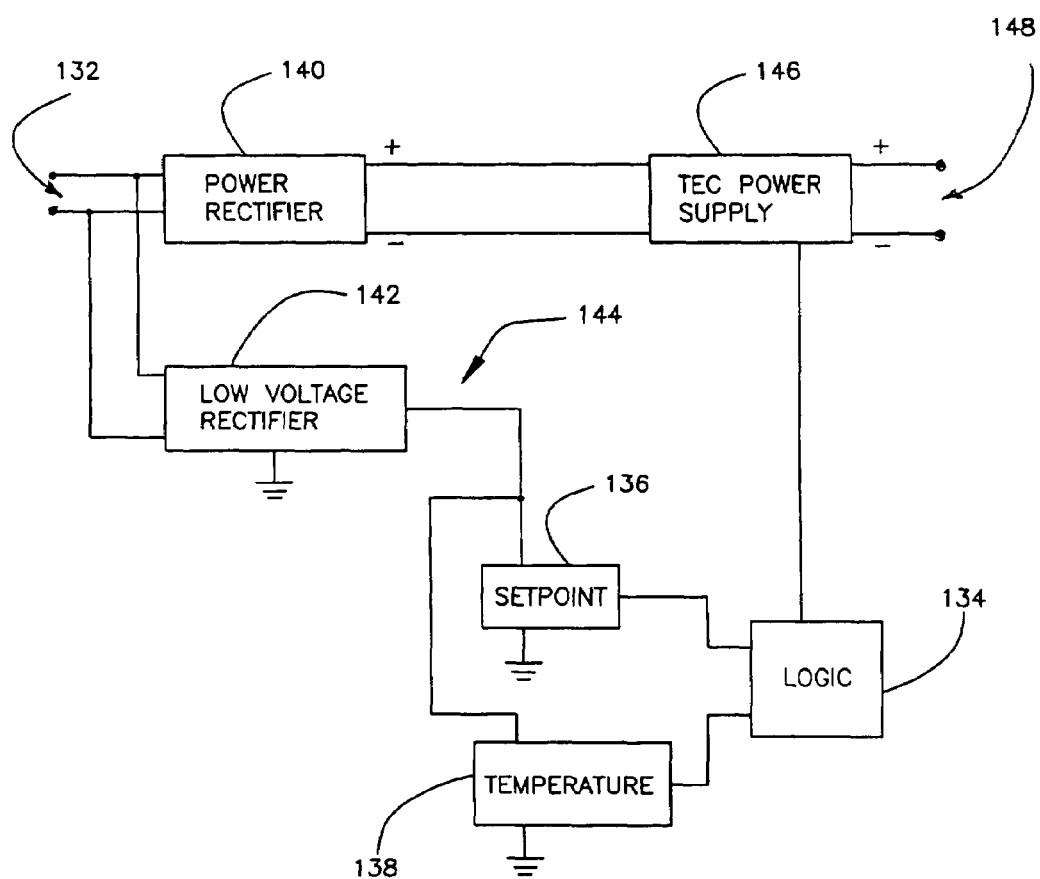
FIG. 6 shows a preferred control circuit for the refrigeration system of the present invention.

FIG. 6 shows one embodiment of an improved system operation controller for the TEC refrigerator of the present invention. In prior practice, simple "ON/OFF" switching is used to control the system drive for temperature regulation. This type of control results in both electrical and thermal fatigue stresses, which soon cause failure, particularly when large amounts of thermal energy are to be pumped. The present invention avoids such problems by using a variable power drive. Power is supplied from 120 VAC source 132 as input to power rectifier 140 and low voltage rectifier 142. Output 144 of low voltage rectifier 142 suppies 12 VDC to setpoint controller 136 and temperature sensor 138. Setpoint controller is adjusted to a selected temperature of approximately 34 degrees F. and temperature sensor 138 responds to the temperature within the enclosure. The setpoint and temperature DC signals are compared in logic circuit 134 and, if the sensed temperature is more than 5-8 degrees F higher than the setpoint, the signal to TEC power control 146 is ramped to full power over a period of 20-30 seconds. Thus, TEC drive voltage 148 is raised from the initial level to maximum, usually in the range of 169 VDC, in a manner that avoids system shock. As the temperature differential decreases to become less than 5 F., logic circuit signals TEC power control 146 to decrease TEC drive voltage 144 proportionately, until a steady state condition is reached. Thus, TEC power control 146 provides full power to TEC drive 148 for maximum cooling, variable down to some fraction of this, as the temperature of the enclosure drops, and only enough to counter thermal leakage once setpoint temperature is achieved. Since there are no thermal shock considerations in fan motor operation, the fan drive is a simple "ON/OFF" control, providing fan power as required.

The embodiments shown and described above are exemplary. It is not claimed that all of the details, parts, elements, or steps described and shown were invented herein. Even though many characteristics and advantages of the present inventions have been described by drawings and accompanying text, the description is illustrative only. Changes may be made in the details, especially in matters of shape, size, and arrangement of the parts within the scope and principles of the inventions. The restrictive description and drawings of the specific examples above do not point out what an infringement of this patent would be, but are to provide at least one explanation of how to use and make the inventions. The limits of the inventions and the bounds of the patent protection are measured by and defined in the following claims.

I claim:

1. Apparatus for thermoelectric cooling of an insulated enclosure comprising:
    a plurality of thermoelectric cooling units, with their cold sides exposed to the enclosure interior and their hot sides are exposed to the ambient exterior;
    a plurality of integral, self contained heat pipes within the enclosure having an interior conductive connecting member affixed to the cold sides;
    a plurality of integral, self contained, exterior heat pipes having an exterior conductive connecting member affixed to the hot sides; and
    a stack of heat exchanging fins affixed to each plurality of heat pipes, interior fins to collect heat and exterior fins to disburse heat.

2. Apparatus for thermoelectric cooling according to claim 1 wherein the interior heat pipes use methanol as the working fluid.

3. Apparatus for thermoelectric cooling according to claim 1 wherein the exterior heat pipes use water as the working fluid.

4. Apparatus for thermoelectric cooling according to claim 1 and further comprising a fan for moving air across the exterior fin stack.

5. Apparatus for thermoelectric cooling according to claim 1 wherein the interior connecting members are a common, continuous member.

6. Apparatus for thermoelectric cooling according to claim 1 wherein the exterior connecting members are a common, continuous member.

7. Apparatus for thermoelectric cooling of an insulated enclosure comprising:
- a plurality of thermoelectric cooling units, each having a cold side and a hot side;
- a first common conductive member having the inner face thereof inside of the enclosure and affixed to the cold sides of the thermoelectric cooling units;
- a second common conductive member having the inner face thereof outside of the enclosure and affixed to the hot sides of the thermoelectric cooling units;
- a plurality of individually operative first heat pipes having a first phase-changeable fluid with an end affixed to the first common conductive member;
- a plurality of individually operative second heat pipes having a second phase-changeable fluid with an end affixed to the second common conductive member;
- a stack of heat collecting fins affixed to the first heat pipes within the insulated enclosure; and
- a stack of heat dissipating fins affixed to the second heat pipes outside of the insulated enclosure.

8. Apparatus for thermoelectric cooling according to claim 7 wherein the first fluid is methanol.

9. Apparatus for thermoelectric cooling according to claim 7 wherein the second fluid is water.

10. Apparatus for thermoelectric cooling according to claim 7 and further comprising a fan for moving air across the exterior fin stack.

11. Apparatus for thermoelectric cooling according to claim 7 and further comprising a fan for moving air across the interior fin stack.

* * * * *